(12) United States Patent
Kim

(10) Patent No.: US 9,190,530 B2
(45) Date of Patent: Nov. 17, 2015

(54) THIN FILM TRANSISTOR IN WHICH THE GATE ELECTRODE HAS THE SAME THICKNESS AS AN INSULATING LAYER

(71) Applicant: Samsung Display Co., Ltd., Yongin, Gyeonggi-Do (KR)

(72) Inventor: Ki-Hyun Kim, Yongin (JP)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 89 days.

(21) Appl. No.: 14/013,205

(22) Filed: Aug. 29, 2013

(65) Prior Publication Data

US 2014/0183635 A1      Jul. 3, 2014

(30) Foreign Application Priority Data

Dec. 28, 2012 (KR) .................. 10-2012-0157070

(51) Int. Cl.
*H01L 27/12* (2006.01)
*H01L 29/423* (2006.01)
*H01L 29/786* (2006.01)
*H01L 29/66* (2006.01)

(52) U.S. Cl.
CPC ...... *H01L 29/78696* (2013.01); *H01L 27/1292* (2013.01); *H01L 29/42384* (2013.01); *H01L 29/66742* (2013.01); *H01L 29/78603* (2013.01); *H01L 29/78636* (2013.01)

(58) Field of Classification Search
CPC ............... H01L 27/1292; H01L 29/42384; H01L 29/78696
See application file for complete search history.

(56) References Cited

U.S. PATENT DOCUMENTS

| 8,269,220 | B2 * | 9/2012 | Ryu et al. .................. 257/59 |
| 2008/0016686 | A1 | 1/2008 | Lee et al. |
| 2010/0078644 | A1 | 4/2010 | Park et al. |
| 2011/0050733 | A1 * | 3/2011 | Yano et al. .................. 345/690 |

FOREIGN PATENT DOCUMENTS

| KR | 10-0763837 B1 | 9/2007 |
| KR | 10-0858223 B1 | 9/2008 |
| KR | 10-2010-0035410 A | 4/2010 |

* cited by examiner

*Primary Examiner* — Thanh V Pham
(74) *Attorney, Agent, or Firm* — Robert E. Bushnell, Esq.

(57) ABSTRACT

A thin film transistor including a first insulating layer disposed on a substrate and having a first hole; a second insulating layer disposed on the substrate and having a second hole; a gate insulating layer disposed between the first and second insulating layers; a gate electrode formed in the first hole; a source electrode and second drain electrode formed at both sides of an inner portion of the second hole; and an activated layer formed between the source electrode and the second drain electrode of the inner portion of the second hole, and having a planarization layer.

5 Claims, 4 Drawing Sheets

THIN FILM TRANSISTOR IN WHICH THE GATE ELECTRODE HAS THE SAME THICKNESS AS AN INSULATING LAYER

CLAIM PRIORITY

This application makes reference to, incorporates the same herein, and claims all benefits accruing under 35 U.S.C. §119 from an application earlier filed in the Korean Intellectual Property Office on 28 Dec. 2012 and there duly assigned Serial No. 10-2012-0157070.

BACKGROUND OF THE INVENTION

1. Field of the Invention

This present invention generally relates to a thin film transistor and a method for manufacturing the same.

2. Description of the Related Art

In general, a thin film transistor configuring a semiconductor device has a structure in which several layers, such as an insulating layer, a semiconductor layer, a conductive layer, or the like, are stacked. However, since each of the layers is patterned so as to have a specific shape, step parts are created on a surface of the thin film transistor.

The above information disclosed in this Related Art section is only for enhancement of understanding of the background of the invention and therefore it may contain information that does not form the prior art that is already known to a person of ordinary skill in the art.

SUMMARY OF THE INVENTION

An object of the present invention is to provide a thin film transistor capable of reducing step parts of the surface thereof and a method for manufacturing the same.

In order to achieve the above mentioned object, according to one aspect of the present invention comprises: there is provided a thin film transistor comprising: a substrate; a first insulating layer disposed on the substrate and having a first hole; a second insulating layer disposed on the substrate and having a second hole; a gate insulating layer disposed between the first and second insulating layers; a gate electrode formed in the first hole; a source electrode and second drain electrode formed at both sides of an inner portion of the second hole; and an activated layer formed between the source electrode and the second drain electrode of the inner portion of the second hole.

According to another aspect of the present invention, there is provided a method for manufacturing a thin film comprising: forming a first insulating layer on a substrate and then forming a first hole in the first insulating layer; forming a gate electrode in an inner portion of the first hole; forming a gate insulating layer and a second insulating layer on the first insulating layer including the gate electrode; forming a second hole in the second insulating layer and then forming a conductive layer in an inner portion of the second hole; forming a third hole in the conductive layer such that source and drain electrodes made of the conductive layer are formed; and forming an activated layer in an inner portion of the third hole.

According to yet another aspect of the present invention, there is provided a method for manufacturing a thin film comprising: forming a second insulating layer on a substrate and then forming a second hole in the second insulating layer; forming a conductive layer in an inner portion of the second hole and then forming a third hole in the conductive layer such that source and drain electrodes made of the conductive layer are formed; forming an activated layer in an inner portion of the third hole; forming a gate insulating layer on the second insulating layer including the source and drain electrodes and the activated layer; forming a first insulating layer on the gate insulating layer and then forming a first hole in the insulating layer; and forming a gate electrode in an inner portion of the first hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
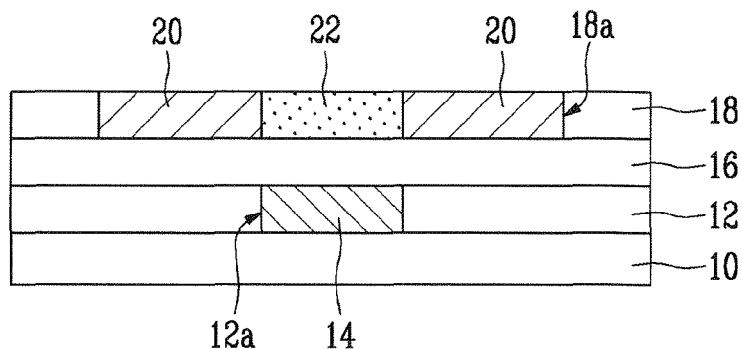
FIGS. 1 and 2 are cross-sectional views for explaining a thin film transistor according to an exemplary embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the thin-film transistor, active layers and electrodes are made of semiconductors and metal, respectively, are separately formed in their specific regions due to electrical characteristics thereof, which causes the surface of the thin-film transistor to have large step parts.

The step parts on the surface make it difficult to perform a manufacturing process, for example, a process of forming a light emitting device, at an upper portion of the thin film transistor, and are cause of reducing efficiency in the light emitting of the light emitting device.

In order to reduce the step parts of the surface, a thick planarization layer with a high viscosity is used. However, since the planarization layer needs to be coated and cured at a high temperature, there is a problem requiring much time and a number of equipments.

Figure 2:
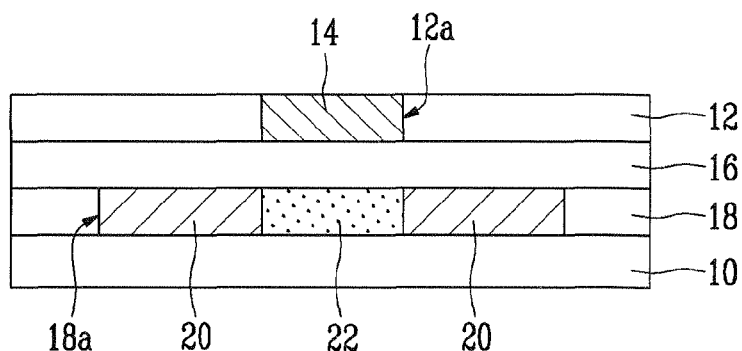

FIGS. 1 and 2 are cross-sectional views for explaining a thin film transistor according to an exemplary embodiment of the present invention.

The thin film transistor may be configured to include a first insulating layer 12 disposed on a substrate 10 and having a first hole 12a, a second insulating layer 18 disposed on the substrate 10 and having a second hole 18a, a gate insulating layer 16 disposed between the first insulating layer 12 and a second insulating layer 18, a gate electrode 14 formed in an inner portion of the first hole 12a, source and drain electrodes 20 each formed on both sides of an inner portion of the second hole 18a, and an activated layer 22 formed between the source electrode and the drain electrode 20 in the inner portion of the second hole 18a.

The substrate 10 may be composed of a thin film shaped semiconductor, glass, plastic, metal, and the first insulating layer 12, the gate insulating layer 16, and the second insulating layer 18 may be formed of a silicon oxide film, silicon nitride film, or a stacked structure thereof.

The first hole 12a and the second hole 18a may be formed by a hot embossing technology. The first hole 12a and the second hole 18a are overlapped with each other, and the second hole 18a has a size larger than that of the first hole 12a.

The gate electrode 14 has the same thickness as that of the first insulating layer 12, and the source electrode and drain electrode 20 has the same thickness as that of the second insulating layer 18.

The gate electrode 14 and the source and drain electrodes 20 may be made of a conductive material such as conductive ink, and the activated layer 22 may be made of an inorganic semiconductor, an organic semiconductor, or oxide semiconductor. The activated layer 22 includes a channel region, and a source region and a drain region each disposed in both sides of the channel region.

FIG. 1 shows a bottom gate structure in which the first insulating layer 12 having the gate electrode 14 may be disposed on the bottom of the second insulating layer 18, and FIG. 2 shows a top gate structure in which the first insulating layer 12 having the gate electrode 14 may be disposed on an top of the second insulating layer 18.

In FIGS. 3A to 3F, which are cross-sectional views for explaining a method for manufacturing a thin film transistor according to an exemplary embodiment of the present invention, a method for manufacturing the bottom gate structure shown in FIG. 1 will be described.

Figure 3A:
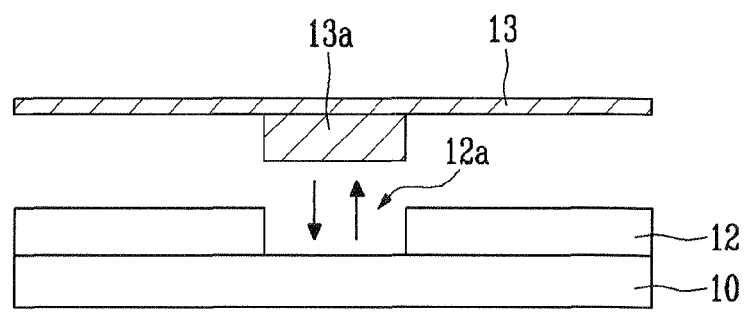
FIGS. 3A to 3F are cross-sectional views for explaining a method for manufacturing a thin film transistor according to an exemplary embodiment of the present invention.

Referring to FIG. 3A, the first insulating layer 12 may be formed on the substrate 10 and then the first hole 12a may be formed in the first insulating layer 12. The first hole 12a may be formed by the hot embossing technology. The hot embossing technology is one that duplicates a fine pattern using a master, for example, heating a master 13 having a protruded pattern 13a, tightly attaching it to the first insulating layer 12, and applying it with a certain pressure to thereby form the first hole 12a corresponding to the protruded pattern 13a in the first insulating layer 12.

Figure 3B:
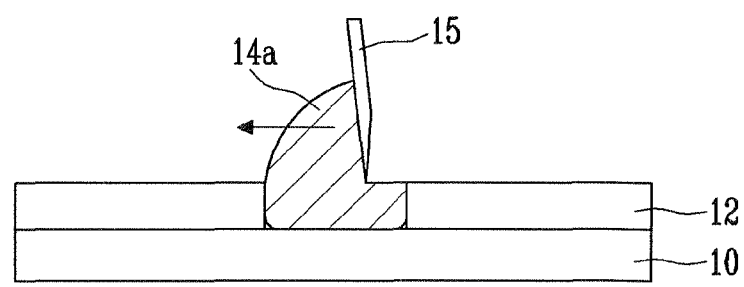
Figure 3C:
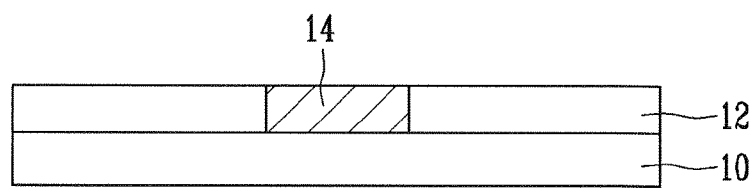

Referring to FIGS. 3B and 3C, the conductive material may be injected into the inner portion of the first hole 12a to form the gate electrode 14. The conductive material is preferably a liquid material such as conductive ink so as to be easily injected into the inner portion of the hole having a fine size. For example, the conductive ink 14a may be injected into the inner portion of the first hole 12a using a printing method and the conductive ink 14a on an outer portion of the first hole 12a may be removed using a blade 15, thereby making it possible to form the gate electrode 14 having the same thickness as that of the first insulating layer 12.

Figure 3D:
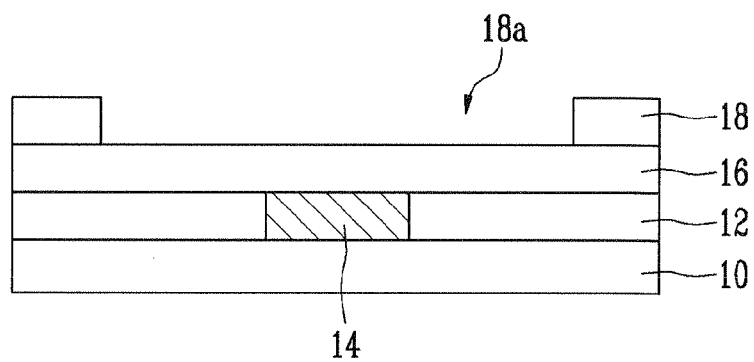

Referring to FIG. 3D, the gate insulating layer 16 and the second insulating layer 18 are sequentially formed on the first insulating layer 12 including the gate electrode 14, and then the second hole 18a may be formed in the second insulating layer 18. The second hole 18a may be formed in the second insulating layer 18 using the embossing technology described in FIG. 3A. Here, the protruded pattern of the master has to have a width wider than that of the gate electrode 14, and the gate electrode 14 may be positioned in the central portion of the second hole 18a.

Figure 3E:
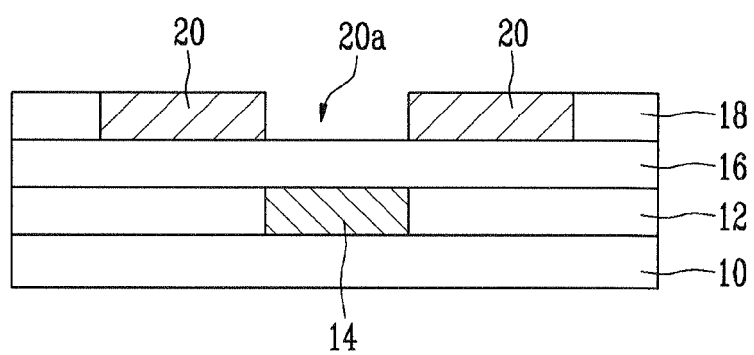

Referring to FIG. 3E, the conductive material may be injected into the inner portion of the second hole 18a to form a conductive layer and then a third hole 20a may be formed in the conductive layer. The conductive layer is preferably a liquid material such as conductive ink so as to be easily injected into the inner portion of the hole having a fine size. For example, the conductive layer may be formed by injecting the conductive ink into the inner portion of the second hole 18a in the printing method and removing the conductive ink on the outer portion of the second hole 18a using the blade. The third hole 20a may have almost the same width as that of the gate electrode 14. The third hole 20a may be formed in the conductive layer by a hot embossing technology using the master which has a protruded pattern with almost the same width as that of the gate electrode 14. The third conductive layer may be patterned by the third hole 20a and source and drain electrodes 20 made of the conductive layer are formed each at the both sides of the third hole 20a.

Figure 3F:
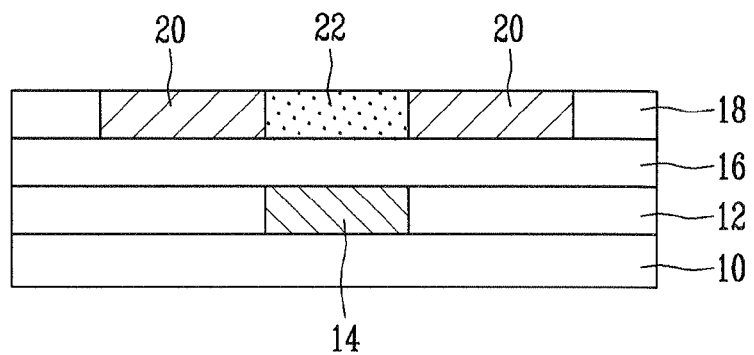

Referring to FIG. 3F, the activated layer 22 may be formed in the inner portion of the third hole 20a between the source and drain electrodes 20. The activated layer 22 may be made of an inorganic semiconductor, an organic semiconductor, or oxide semiconductor. The activated layer 22 may be preferably made of a liquid material so as to be easily injected into the inner portion of the hole having a fine size.

In FIGS. 4A to 4E, which are cross-sectional views for explaining a method for manufacturing a thin film transistor according to an exemplary embodiment of the present invention, the method for manufacturing the top gate structure shown in FIG. 2 which will be described.

Figure 4A:
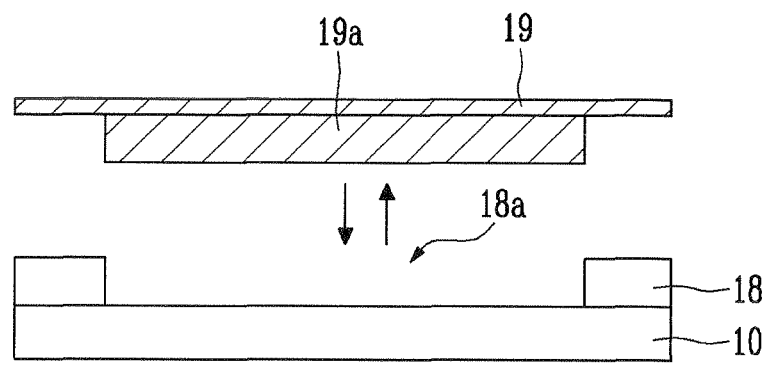
FIGS. 4A to 4E are cross-sectional views for explaining a method for manufacturing a thin film transistor according to an exemplary embodiment of the present invention.

Referring to FIG. 4A, the second insulating layer 18 may be formed on the substrate 10 and then the second hole 18a may be formed in the second insulating layer 18. The second hole 18a may be formed by the hot embossing technology. For example, a master 19 having a protruded pattern 19a is heated, tightly attached to the second insulating layer 18, and applied with a certain pressure to thereby form the second hole 18a corresponding to the protruded pattern 19a in the second insulating layer 19a.

Figure 4B:
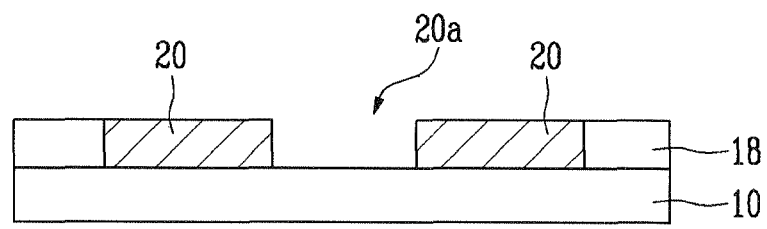

Referring to FIG. 4B, the conductive layer may be formed by injecting the conductive material into the inner portion of the second hole 18a, and then the third hole 20a may be formed in the conductive layer. The conductive layer is preferably a liquid material such as conductive ink so as to be easily injected into the inner portion of the hole having a fine size. For example, the conductive layer may be formed by injecting the conductive ink into the inner portion of the second hole 18a in the printing method and removing the conductive ink on the outer portion of the second hole 18a using the blade. The third hole 20a may be formed by the hot embossing technology described in FIG. 3E. The third conductive layer may be patterned by the third hole 20a and the source and drain electrodes 20 made of the conductive layer are formed each at the both sides of the third hole 20a.

Figure 4C:
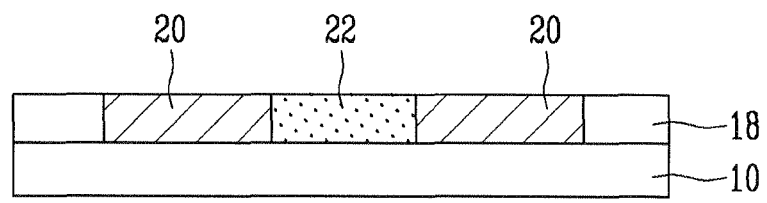

Referring to FIG. 4C, the activated layer 22 may be formed in the inner portion of the third hole 20a between the source electrode and the drain electrode 20. The activated layer 22 may be made of an inorganic semiconductor, an organic semiconductor, or oxide semiconductor. The activated layer 22 may be preferably made of a liquid material so as to be easily injected into the hole having a fine size.

Figure 4D:
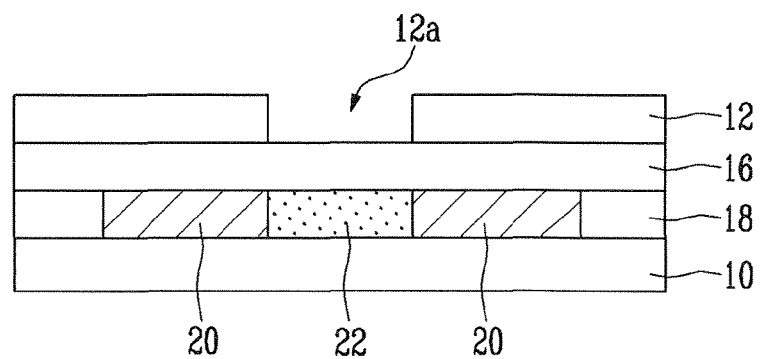

Referring to FIG. 4D, the gate insulating layer 16 and the second insulating layer 12 are sequentially formed on the second insulating layer 18 including the source and drain electrodes 20 and the activated layer 22, and then the first hole 12a may be formed in the first insulating layer 12. The first hole 12a may be formed in the first insulating layer 12 using the embossing technology described in FIG. 3A. Here, the protruded pattern of the master need to have a width narrower than that of the second hole 18a, and the activated layer 22 may be overlapped with the first hole 12a.

Figure 4E:
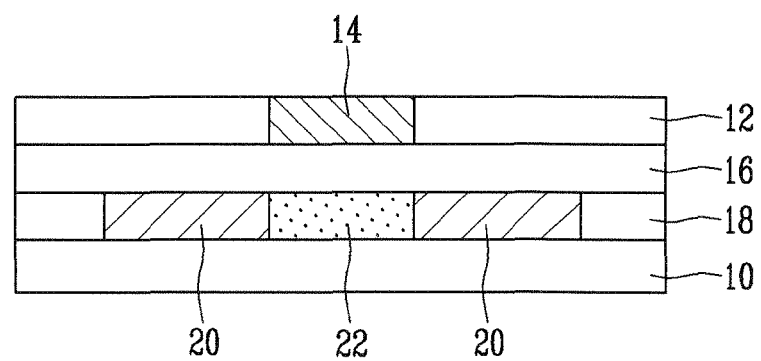

Referring to FIG. 4E, the conductive material may be injected into the inner portion of the first hole 12a to form the gate electrode 14. The conductive material is preferably a liquid material such as conductive ink so as to be easily injected into the hole having a fine size. For example, the conductive ink may be injected into the inner portion of the first hole 12a using the printing method and the conductive ink 14a on the outer portion of the first hole 12a may be removed using the blade, thereby making it possible to form the gate electrode 14 having the same thickness as that of the first insulating layer 12.

Since the hole having the fine size may be formed and the activated layer and respective electrodes are formed in the inner portion of the hole in the exemplary embodiment according to the present invention, the respective electrodes and the activated layer may be made of the liquid material. The liquid material may include a main material having a particle shape, an auxiliary material for facilitating printing (applying), or the like. In addition, in order to cure the liquid material, a heat treatment process may be included.

Since the thin film transistor manufactured according to the exemplary embodiment of the present invention has no step part on the surface thereof, there is no need to form the planarization layer at the upper portion of the thin film transistor, or the planarization layer, if any, may have a thin thickness. In the case in which the planarization layer has a thickness of, for example, 1 µm or less, the process time and temperature may be significantly reduced compared to those of the related art.

Further, since the thin film transistor according to the exemplary embodiments of the present invention has the hole having the fine size formed using the hot embossing technology and the hole has the activated layer and respective electrodes formed therein using the liquid material, the thin film transistor according to the present invention may be easily applied to high-integrated devices.

Figure 5:
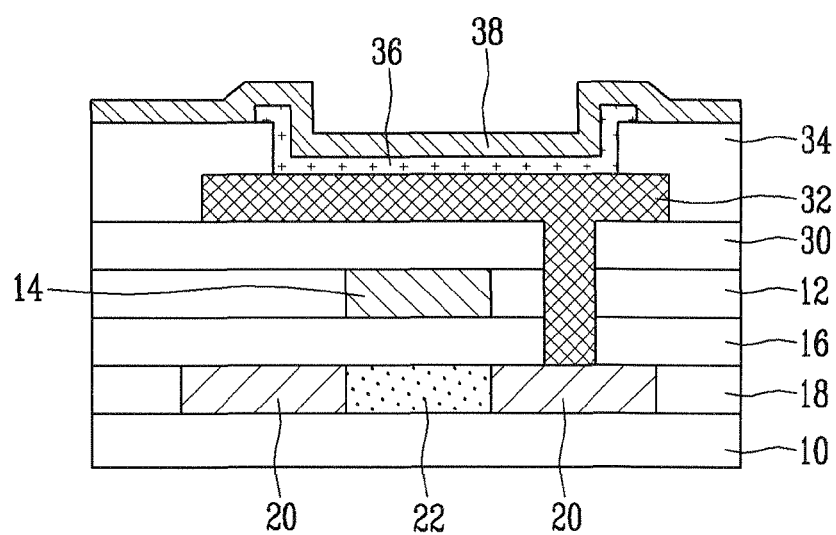
FIG. 5 is a cross-sectional view for explaining an organic light emitting display device using a thin film according to an exemplary embodiment of the present invention.

FIG. 5 is an example in which the thin film transistor according the exemplary embodiment of the present invention is applied to an organic light emitting display device, wherein the thin film transistor having the top gate structure may be applied to the organic light emitting display device.

As shown in FIG. 2, the thin film transistor according the exemplary embodiment of the present invention has a planarized surface, therefore, does not have to have a separate planarization layer. Therefore, a protection layer having a relatively thin thickness may be formed on the first insulating layer 12 including the gate electrode 14, and a via hole is formed to expose the drain electrode 20 by patterning the first insulating layer 12 and the gate insulating layer 16. An anode electrode 32 may be formed on the protection layer to be connected to the drain electrode 20 through the via hole, and a pixel defined layer 34 may be formed to expose the anode electrode 32 in a light emitting region. An organic light emitting layer 36 may be formed on the exposed anode electrode 32, and a cathode electrode 38 may be formed on the organic light emitting layer 36.

Since the light emitting device may be formed on the upper portion of thin film transistor, the thin film transistor may be easily manufactured and the deterioration in efficiency thereof due to step parts does not occur.

As set forth above, according to the exemplary embodiments of the present invention, the activated layer and respective electrodes of the thin film transistor are formed in the injected shape in the inner portion of the hole of the insulating layer, such that step parts of the surface of the thin film transistor are not created. Therefore, the thin film transistor may be formed without the planarization layer on the top portion thereof or in a thin thickness, thereby making it possible to simplify manufacturing processes. In addition, since the thin film transistor according to the exemplary embodiments of the present invention has the hole having the fine size formed using the hot embossing technology and the hole has the activated layer and respective electrodes formed therein using the liquid material, the thin film transistor according to the present invention may be easily applied to high-integrated devices.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor, comprising:
   a substrate;
   a first insulating layer disposed on the substrate and having a first hole;
   a second insulating layer disposed on the substrate and having a second hole;
   a gate insulating layer disposed between the first and second insulating layers;
   a gate electrode formed in the first hole;
   a source electrode and second drain electrode formed at both sides of an inner portion of the second hole; and
      an activated layer formed between the source electrode and the second drain electrode of the inner portion of the second hole,
   wherein the gate electrode has the same thickness as that of the first insulating layer, and
   wherein the source electrode and the drain electrode and the activated layer have the same thickness as that of the second insulating layer.

2. The thin film transistor according to claim 1, wherein the first hole and the second hole are formed using a hot embossing technology.

3. The thin film transistor according to claim 1, wherein the first and second holes are overlapped with each other, and the second hole has a size bigger than that of the first hole.

4. The thin film transistor according to claim 1, wherein the gate electrode and the source electrode and the drain electrode are made of conductive ink.

5. The thin film transistor according to claim 1, wherein the activated layer is made of one of an inorganic semiconductor, and organic semiconductor, and oxide semiconductor.

* * * * *